US012696716B2

(12) United States Patent (10) Patent No.: US 12,696,716 B2
Sivignon (45) Date of Patent: Jul. 28, 2026

(54) Z-ROTARY WAFER POSITIONING STAGE COMPRISING A LIFT-PIN MECHANISM

(71) Applicant: ETEL S.A., Môtiers (CH)

(72) Inventor: Eric Sivignon, Môtiers (CH)

(73) Assignee: ETEL S.A., Môtiers (CH)

( * ) Notice: Subject to any disclaimer, the term of this patent is extended or adjusted under 35 U.S.C. 154(b) by 961 days.

(21) Appl. No.: 17/963,321

(22) Filed: Oct. 11, 2022

(65) Prior Publication Data

US 2023/0133957 A1 May 4, 2023

(30) Foreign Application Priority Data

Oct. 28, 2021 (EP) ..................................... 21205342

(51) Int. Cl.
$$\begin{array}{lll} \textbf{\textit{H10P 72/00}} & (2026.01) \\ \textbf{\textit{H10P 72/72}} & (2026.01) \\ \textbf{\textit{H10P 72/76}} & (2026.01) \end{array}$$

(52) U.S. Cl.
CPC ........ H10P 72/0606 (2026.01); H10P 72/722 (2026.01); H10P 72/7612 (2026.01)

(58) Field of Classification Search
CPC . H10P 72/0606; H10P 72/722; H10P 72/7612
USPC ...................................................... 269/54.4
See application file for complete search history.

(56) References Cited

U.S. PATENT DOCUMENTS 5,989,342 A * 11/1999 Ikeda .................. H10P 72/7608
156/345.55
6,485,248 B1 * 11/2002 Taylor, Jr. ........... H10P 72/3306
414/217

2008/0127888 A1 * 6/2008 Kim ..................... H10P 72/7608
118/500
2009/0325469 A1 * 12/2009 Koo ......................... B24B 37/30
451/388
2010/0083986 A1 4/2010 Kamikawa et al.
2010/0130105 A1 * 5/2010 Lee ......................... B24B 37/04
451/388

(Continued)

FOREIGN PATENT DOCUMENTS

EP 4047250 A1 8/2022

OTHER PUBLICATIONS

European Search Report issued in corresponding EP Application No. 21205342.5 dated Mar. 16, 2022, pp. 1-2.

*Primary Examiner* — Seahee Hong

(74) *Attorney, Agent, or Firm* — Carter, DeLuca & Farrell LLP

(57) ABSTRACT

A Z-rotary wafer positioning stage includes a stationary unit, a Z-unit actuatable upwardly and downwardly relative to the stationary unit, a rotary unit having a wafer chuck rotatably mounted in the Z-unit, a rotary motor for rotating the rotary unit relative to the Z-unit, and a lift-pin mechanism including lift-pins aligned with through-holes extending through the wafer chuck. The lift-pin mechanism can be toggled between a first position, in which the distal ends of the lift-pins are below or at the level of the wafer chuck surface, and a second position, in which the distal ends of the lift-pins extend above the wafer chuck surface. The Z-rotary wafer positioning stage includes upper magnet(s) and lower magnet(s) to hold the lift-pin mechanism in the first position and second position, respectively, and electromagnet(s) configured to be energized to toggle the lift-pin mechanism between the first and second positions.

15 Claims, 5 Drawing Sheets

(56)             References Cited

U.S. PATENT DOCUMENTS

| | | | |
|---|---|---|---|
| 2011/0303527 A1* | 12/2011 | Hosoya | C23C 14/505 |
| | | | 204/192.15 |
| 2013/0152971 A1* | 6/2013 | Kato | H10P 72/7608 |
| | | | 134/21 |
| 2016/0096205 A1* | 4/2016 | Kato | B08B 3/02 |
| | | | 134/21 |
| 2017/0092532 A1* | 3/2017 | Kaba | H10P 72/7612 |
| 2017/0133260 A1 | 5/2017 | Pohl et al. | |
| 2018/0251892 A1* | 9/2018 | Kobayashi | C23C 16/45544 |
| 2022/0076979 A1* | 3/2022 | Prasad | H10P 72/3308 |

* cited by examiner

Z-ROTARY WAFER POSITIONING STAGE COMPRISING A LIFT-PIN MECHANISM

CROSS-REFERENCE TO RELATED APPLICATIONS

The present application claims priority to Application No. 21205342.5, filed in the European Patent Office on Oct. 28, 2021, which is expressly incorporated herein in its entirety by reference thereto.

FIELD OF THE INVENTION

The present invention relates generally to semiconductor processing equipment and more particularly to a Z-rotary wafer positioning stage that includes a lift-pin mechanism, e.g., adapted to raise a wafer off the stage surface for wafer removal. The present invention also relates to a method of operating the Z-rotary wafer positioning stage, e.g., to toggle the lift-pin mechanism between a first position, in which the wafer chuck holds a wafer, and a second position, in which the wafer is lifted off the stage.

BACKGROUND INFORMATION

Wafer positioning stages are often used to hold wafers in place while they are being tested. Most wafers are held in place by applying a small amount of vacuum to the backside of the wafer. Once the processing is completed, the wafer needs to be unloaded from the wafer chuck. To that end, the stage includes a lift-pin mechanism configured to be actuated in a Z-direction to raise the wafer off the wafer chuck surface so that a wafer removing tool can be inserted under the wafer to remove it from the stage.

European Patent Document No. 4 047 250 describes a Z-rotary wafer positioning stage including a stationary unit, a Z-unit, a linear motor for fine upward and downward movements of the Z-unit relative to the stationary unit, a rotatable unit with a wafer chuck rotatably mounted inside the Z-unit, and a rotary motor arranged to rotate the rotary unit relative to the Z-unit. The rotary unit includes a lift-pin mechanism actuatable by a dedicated magnetic Z-actuator to move lift-pins from a retracted position to an extended position and vice versa.

Another example of lift-pin mechanism which relies on a dedicated actuator is described, for example, in U.S. Patent Application Publication No. 2017/0133260.

High-end wafer positioning stages with lift-pin mechanisms require at least a first actuator and a rotary encoder to control fine angular movement of the stage, a second actuator and a linear encoder to control fine vertical movements of the stage, and a third actuator to actuate the lift-pin mechanism to move lift-pins from a retracted position to an extended position and vice versa.

At least three independent actuators are therefore needed which increase the complexity, the footprint, and the cost of such high-end wafer positioning stages.

SUMMARY

Example embodiments of the present invention provide a cost-effective Z-rotary positioning stage, provide a Z-rotary positioning stage having a reduced footprint, and/or provide a Z-rotary positioning stage with a simplified architecture to achieve high-reliability.

According to an example embodiment of the present invention, a Z-rotary wafer positioning stage includes a stationary unit, a Z-unit actuatable upwardly and downwardly relative to the stationary unit, a rotary unit with a wafer chuck rotatably mounted in the Z-unit, a rotary motor arranged to rotate the rotary unit relative to the Z-unit, and a lift-pin mechanism including lift-pins aligned with through-holes extending through the wafer chuck. The lift-pin mechanism is configured to be toggled between a first stable position, in which distal ends of the lift-pins are below or at the level of the wafer chuck surface, and a second stable position, in which the distal ends of the lift-pins extend above the wafer chuck surface. The Z-rotary wafer positioning stage further includes at least one upper magnet to hold the lift-pin mechanism in the first stable position, at least one lower magnet to hold the lift-pin mechanism in the second stable position, and at least one electromagnet configured to be energized to toggle the lift-pin mechanism from the second stable position to the first stable position. The electromagnet may also be configured to be energized to toggle the lift-pin mechanism from the first stable position to the second stable position.

According to example embodiments, the upper and lower magnets are mounted on the rotary unit.

According to example embodiments, the upper magnet is arranged to magnetically connect to an upper part of the lift-pin mechanism to maintain the lift-pins in the first stable position. The lower magnet is arranged to magnetically connect to a lower part of the lift-pin mechanism to maintain the lift-pins in the second stable position.

According to example embodiments, the electromagnet is mounted on the stationary unit and is arranged to come into contact with the lower part of the lift-pin mechanism and to be energized to maintain the lift-pin mechanism in contact with the electromagnet to disconnect the lower magnet from the lift-pin mechanism to toggle the lift-pin mechanism from the second stable position to the first stable position.

According to example embodiments, the rotary unit includes three upper magnets and three lower magnets. The lift pin-mechanism includes three lift-pins and three lift-pin holders to hold respective lift-pins. The lift-pin holders are made of a magnetic material and are shaped so as to be in contact with respective: (a) upper magnets to maintain the lift-pin mechanism in the first stable position, or (b) lower magnets to maintain the lift-pin mechanism in the second stable position.

According to example embodiments, the stationary unit includes three electromagnets arranged to magnetically connect to the lower part of the lift-pin mechanism.

According to example embodiments, the lift-pin mechanism includes a ring having a top side arranged to magnetically connect to the lower magnets and a bottom side arranged to magnetically connect to the electromagnets.

According to example embodiments, the stationary unit includes a cylindrical guide around which is mounted the rotary unity. One or more hard stops are connected to the inner wall of the cylindrical guide and are shaped to limit the amplitude of the upward moment of the lift-pin mechanism.

According to example embodiments, the upper magnets and lower magnets are mounted on at least one upper magnet support and at least one lower magnet support, respectively. The axial position of the upper and/or lower magnets are adjustable relative to their supports so as to modify the amplitude of the axial displacement of the lift-pin mechanism between the first stable position and second stable position.

According to an example embodiment of the present invention, a method of operating a Z-rotary wafer positioning stage includes: actuating the Z-unit to move the rotary unit downwardly to bring the lift-pin mechanism in contact with the electromagnet; and energizing the electromagnet while actuating the Z-unit to move the rotary unit upwardly to produce a holding force on the lift-pin mechanism exceeding the magnetic force of the lower magnet in order to disconnect the lower magnet from the lift-pin mechanism.

According to example embodiments, the electromagnet is also energized during the actuating to firmly hold the lift-pin mechanism to counteract the attracting force of the lower magnet on the lift-pin mechanism as the lower magnet is about to contact a lower part of the lift-pin mechanism.

According to example embodiments, the electromagnet is energized during the whole transition phase from the second stable position to the first stable position to firmly hold the lift-pin mechanism to counteract the attracting force of the upper magnet on the lift-pin mechanism as the upper magnet approaches and is about to contact an upper part of the lift-pin mechanism.

Further features and aspects of example embodiments of the present invention are described in more detail below with reference to the appended schematic Figures.

DETAILED DESCRIPTION

Figure 1A:
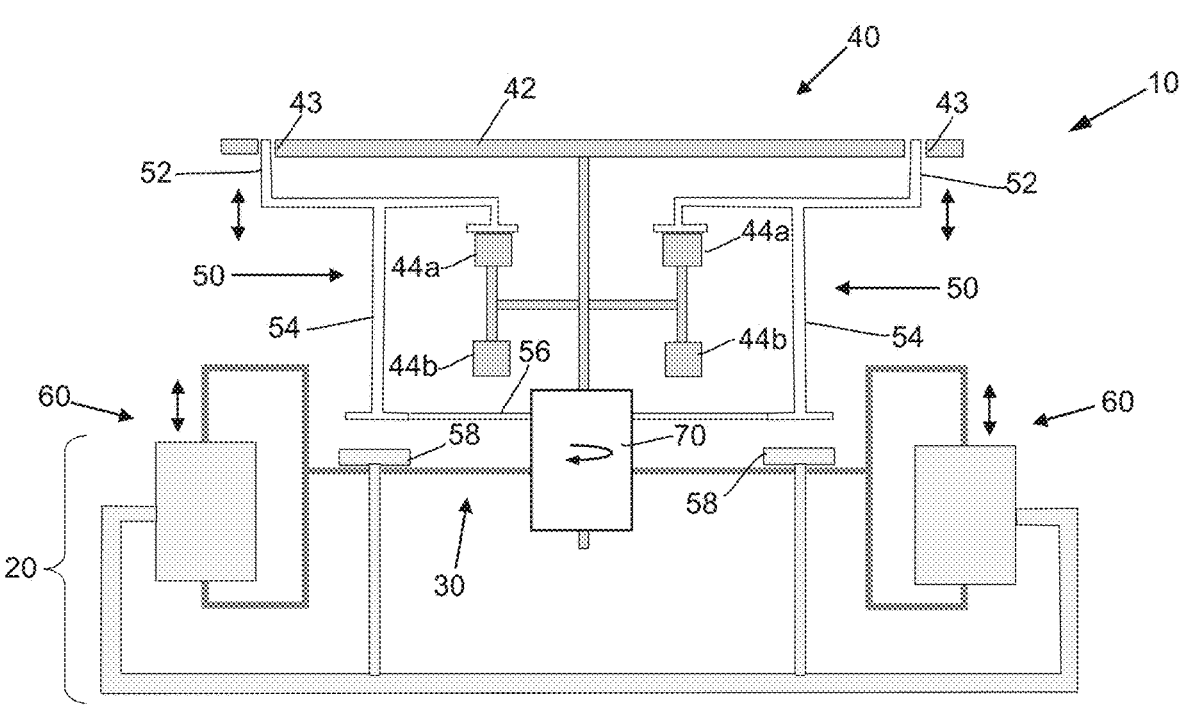
FIGS. 1a to 1d illustrate a sequence of movements of the Z-rotary wafer positioning stage according to an example embodiment of the present invention, when the lift-pin mechanism is toggled from the first stable position to the second stable position and vice versa.

Referring to FIG. 1a, the Z-rotary wafer positioning stage 10 includes a stationary unit 20, a Z-unit 30 moveable upwardly and downwardly relative to the stationary unit 20, a rotary unit 40 rotatably mounted in the Z-unit 30, and a rotary motor 70 arranged to rotate the rotary unit 40 relative the Z-unit 30 about a rotation axis. The rotary unit 40 includes a chuck support 48 (see, e.g., FIG. 4) holding a wafer chuck 42. The wafer chuck 42 includes through-holes 43 extending through the chuck from a top surface to a bottom surface. The through-holes 43 accommodate lift-pins 52 of a lift-pin mechanism 50, which is described in more detail below.

As illustrated in FIGS. 3 to 7, the Z-unit 30 is actuated along the rotation axis by a linear motor 60. To that end, the Z-unit 30 includes a casing 32 having on two opposite sides a magnetic track extending along the vertical direction and a first and second set of coils disposed on the stationary unit 20 to face respective magnetic track.

In a variant, the Z-rotary wafer positioning stage 10 may include two concentric rotary motors as described in European Patent Document No. 1 748 537, which is expressly incorporated herein in its entirety by reference thereto. One of the two rotary motors is adapted to rotate the stage about the rotation axis, and the other of the two rotary motors is adapted to move the stage along the rotation axis.

Figure 5:
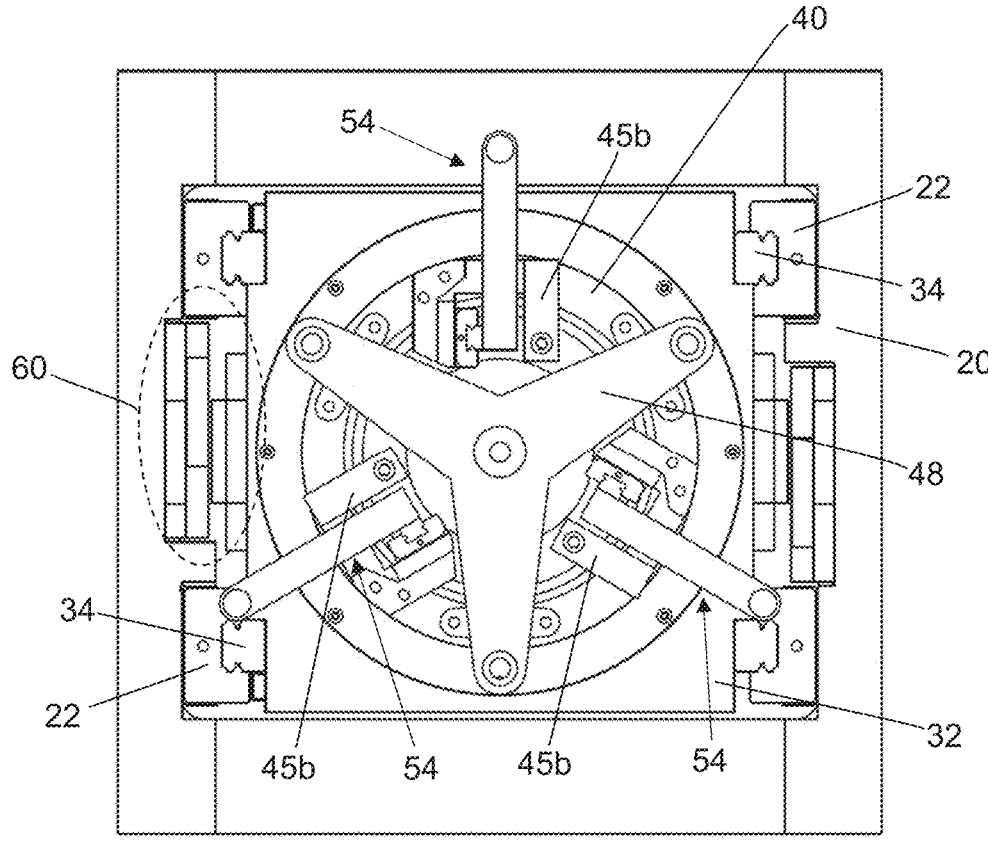
FIG. 5 is a top view of the Z-rotary wafer positioning stage.

As illustrated, for example, in FIG. 5, the casing 32 of the Z-unit 30 includes two rails 34 extending along the vertical direction on both sides of a respective magnetic track. Each rail 34 is slidably engaged with a corresponding carriage 22 mounted on the stationary unit 20 to guide the upward and downward movements of the Z-unit 30.

Figure 6:
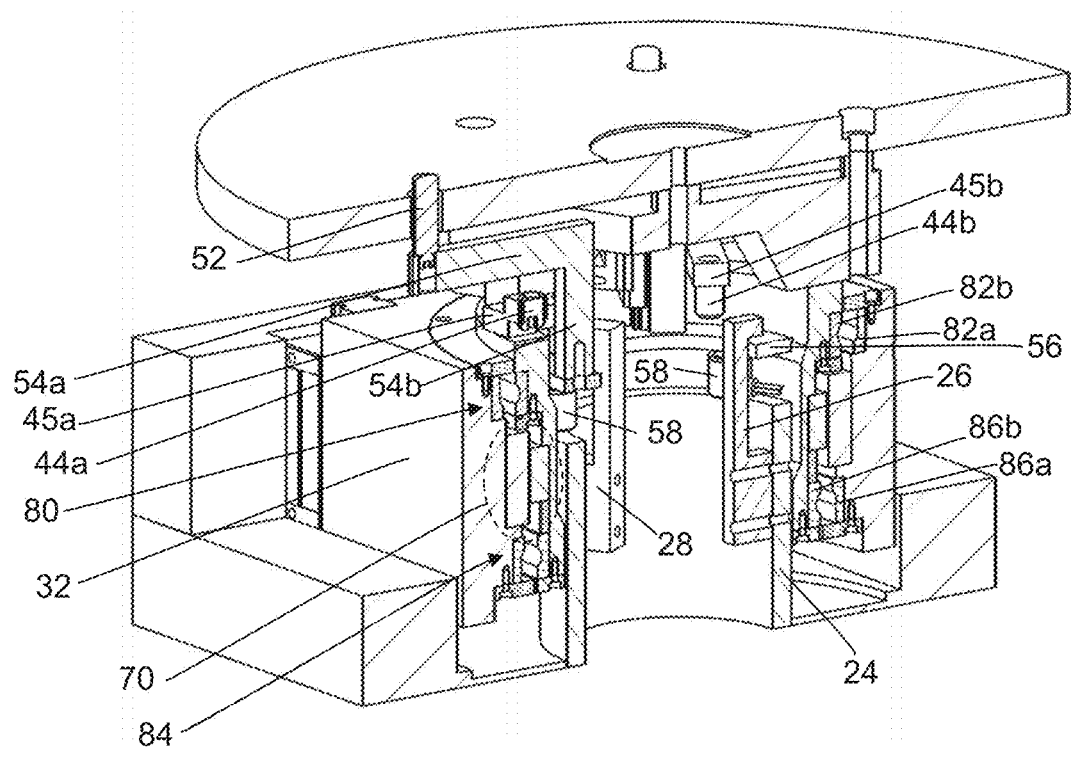
FIG. 6 is a perspective cross-sectional view of the Z-rotary wafer positioning stage.
Figure 7:
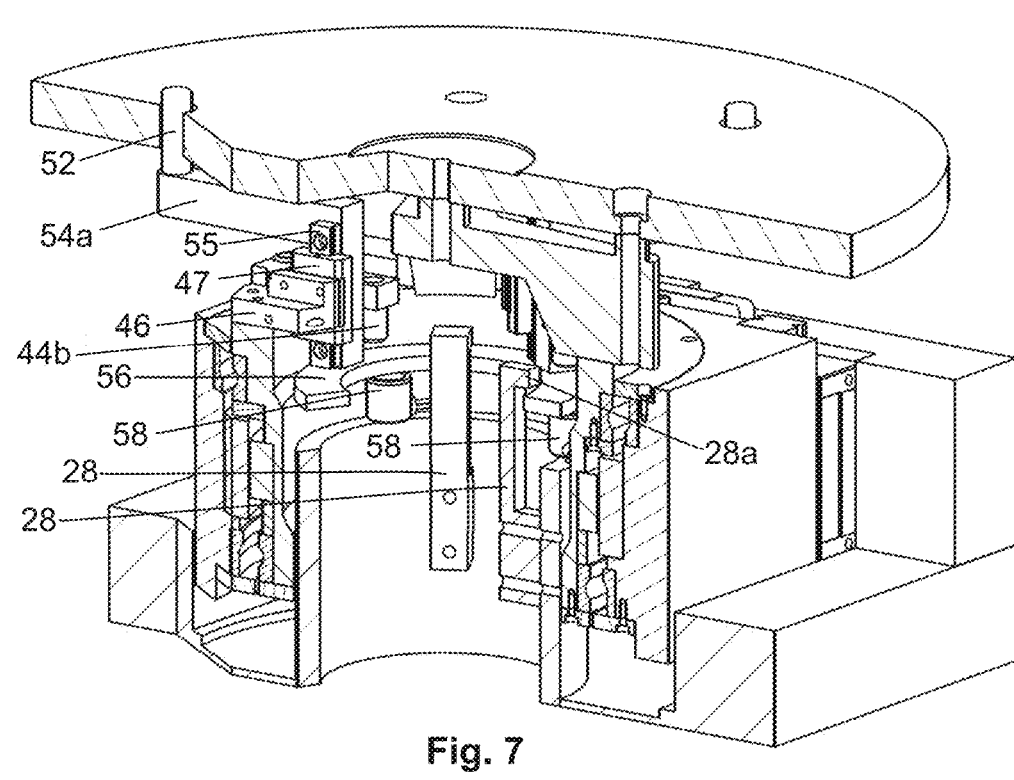
FIG. 7 is another perspective cross-sectional view of the Z-rotary wafer positioning stage.

Referring to FIGS. 5 to 7, the lift-pin mechanism 50 of the Z-rotary wafer positioning stage 10 includes three lift-pin holders 54 angularly spaced apart from each other by 120°. Each lift-pin holder 54 has a first portion 54a extending radially within a plane perpendicular to the rotation axis of the rotary unit 40 and a second portion 54b extending perpendicularly from an end portion of the first portion 54a to form a L-shaped lift-pin holder. A lift-pin 52 is mounted at a distal end of the first portion 54a partly inside the corresponding through-hole 43 of the wafer chuck 42.

The lift-pin mechanism 50 further includes a ring 56 on which an end of the second portion 54b of each pin holder 52 is connected to form an integral lift-pin mechanism. A vertical rail 55 is mounted on the second portion 54b of each pin holder 54 and is slidably engaged with a carriage 47. Pin holder supports 46, connected to the rotary unit 40, support the carriage 47 of respective lift-pin holders 54.

Referring to FIG. 6, the rotary unit 40 is arranged inside the casing 32 of the Z-unit 30 to be rotated by a rotary motor 70. An upper and a lower bearing 80, 84 are mounted between the casing 32 and the rotary unit 40 with the outer rings 82a, 86a and inner rings 82b, 86b of respective bearings 80, 84 forming an integral part with the casing 32 and with the rotary unit 40 respectively.

The stationary unit 20 further includes a cylindrical guide 24 around which is rotatably mounted the rotary unit 40. Several hard stops 28, for example, three hard stops spaced apart from each other by 120°, are connected to the inner wall of the cylindrical guide 24. These hard stops 28 extend upwardly and include a bent-over distal portion 28a arranged to come into contact with a top side of the ring 56 to limit the amplitude of the upward moment of the lift-pin mechanism 50.

One or more upper magnets 44a are mounted on the rotary unit 40 to hold the lift-pin mechanism 50 in a first stable position, in which the distal ends of the lift-pins 52 are below or at the level of the wafer chuck surface. In this first stable position, wafers may be held on the wafer chuck 42 for wafer positioning. One or more lower magnets 44b are mounted on the rotary unit 40 to hold the lift-pin mechanism 50 in a second stable position, in which the distal ends of the lift-pins 52 extend above the wafer chuck surface. In this second position, the wafer is lifted off the wafer chuck 42 for wafer removal. One or more electromagnet 58 are mounted on the stationary unit 20 to toggle the lift-pin mechanism 50, as described in more detail below, from the first stable position to the second stable position in vice versa.

Figure 4:
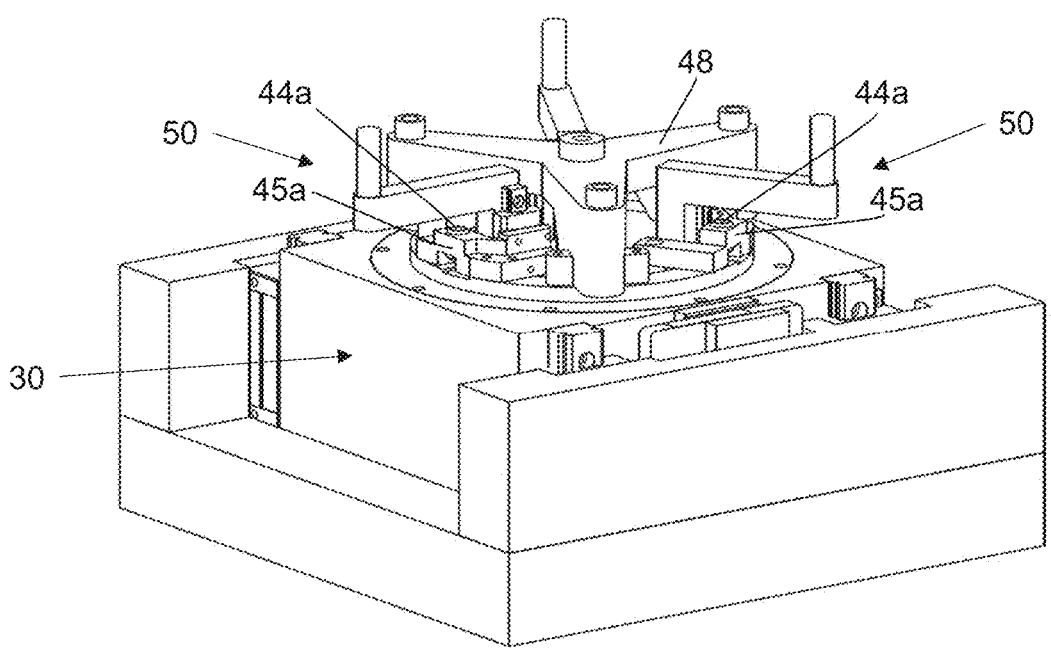
FIG. 4 is another perspective view of the Z-rotary water positioning stage without the wafer chuck.

In the example embodiment illustrated in FIGS. 3 to 7, three upper magnets 44a are mounted on upper magnet supports 45a on an upper part of the rotary unit 40 (see, e.g., FIG. 4). These upper magnets 44a are spaced apart from each other by 120° and are in contact with the first portion 54a of respective lift-pin holder 54 when the lift-pin mechanism 50 is in the first stable position. Three lower magnets 44b are mounted on lower magnet supports 45b (see, e.g., FIG. 5). These lower magnets 44b are in contact with the top side of the ring 56 when the lift-pin mechanism 50 is in the second stable position.

The lift-pin holders 54 and the ring 56 are made of a ferromagnetic metal, such as iron, to be magnetically connected to the upper and lower magnets 44a, 44b in respective first and second stable positions.

The upper and lower magnets 44a, 44b are, for example, engaged with a thread on the upper and lower support magnets 45a, 45b so that their axial position may be adjusted in order to modify the amplitude of the axial movement of the lift-pin mechanism 50 between the first and second positions.

As illustrated in FIGS. 6 and 7, three electromagnets 58 are mounted on an upper circular edge of the cylindrical guide 24 of the stationary unit 20. The electromagnets 58 are spaced apart from each other by 120° and are arranged to come into contact with a bottom side of the ring 56. These electromagnets 58 are configured to be energized to toggle the lift pin mechanism 50 from the first to the second stable positions while operating the Z-rotary wafer positioning stage 10 as described below with reference to FIGS. 1a to 1d and 2.

Referring to FIG. 1a, the lift pin-mechanism 50 is in its first stable position, in which the top surface of the lift pins 52 is set substantially at the level of the surface of the wafer chuck 42. In this position, the upper magnets 44a of the rotary unit 40 are magnetically connected to an upper part of respective lift-pin holders 54, whereas the bottom side of the ring 56 of the lift-pin mechanism 50 is distant from the electromagnets 58 connected to the stationary unit 20.

To toggle the lift-pin mechanism 50 in its second stable position, the following actions are preformed.

Figure 1B:
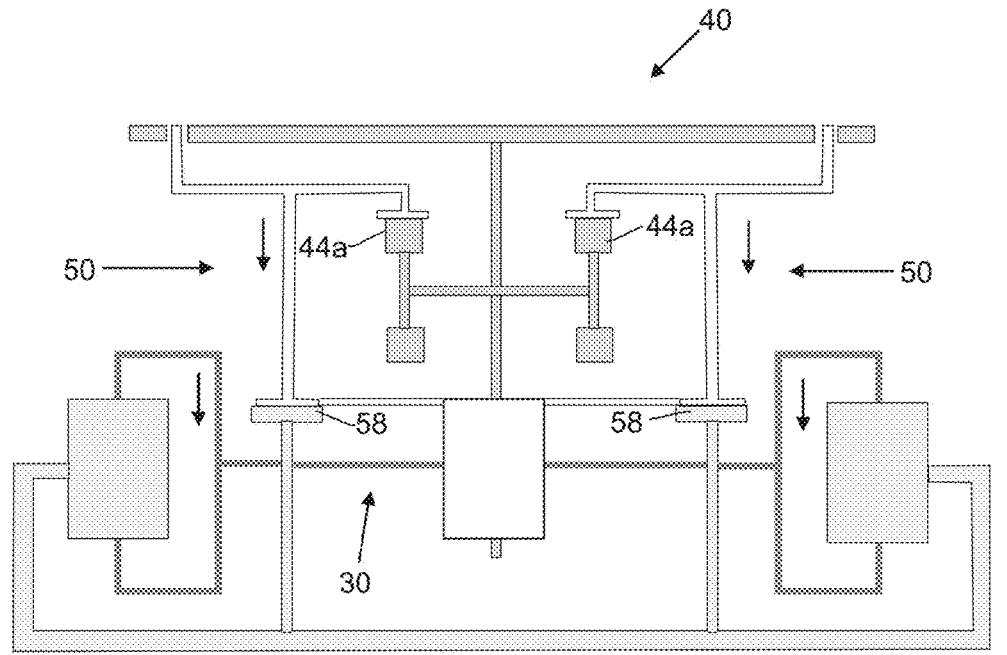
Figure 1C:
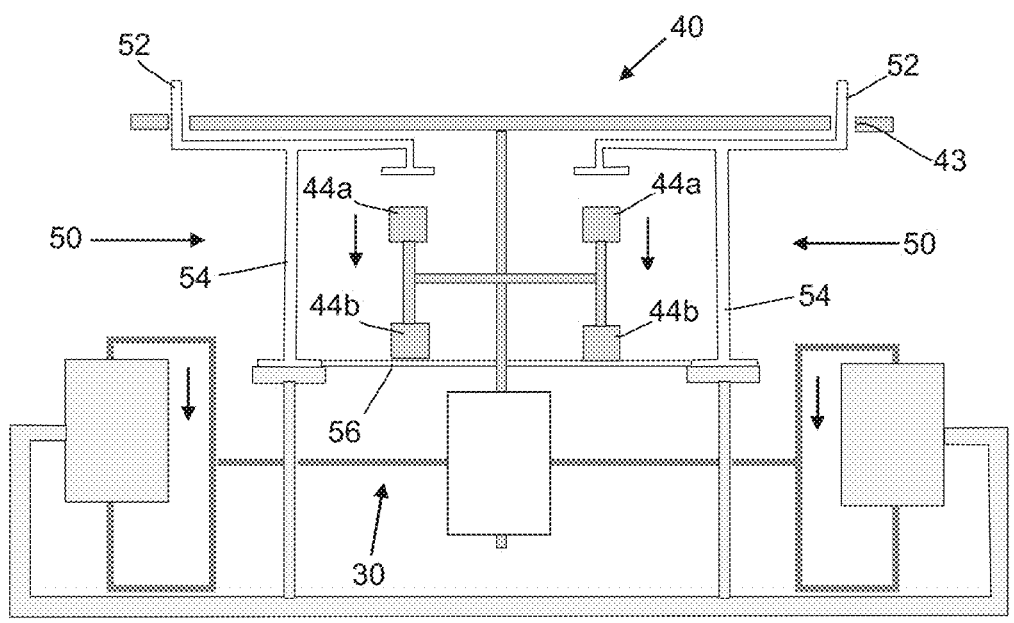

Step 100 includes driving the linear motors 60 to actuate the rotary unit 40 downwardly to bring the bottom side of the ring 56 in contact with the electromagnets 58 as illustrated in FIG. 1b, whereupon the rotary unit 40 is further actuated downwardly to disconnect the upper magnets 44a from respective pin holders 54 as illustrated in FIG. 1c. This produces a relative motion between the rotary unit 40 and the lift pin mechanism.

Step 102 includes turning on the electromagnets 58 before the lower magnets 44b of the rotary unit 40 connect to the ring top side of the lift-pin mechanism 50 to firmly hold the ring 56 in order to counteract the attracting force of the lower magnets 44b on the lift-pin mechanism 50 as they approach and are about to contact the ring top side of the lift-pin mechanism 50.

Step 104 includes turning off the electromagnets 58 as soon as the lower magnets 44b contact the ring top side of the lift-pin mechanism. The lift-pin mechanism is thus in the second stable position, in which the lift-pins 52 protrude from their corresponding through-holes 43 above the surface of the wafer chuck 42. In this position, the rotary unit 40 can be moved upwardly, downwardly, and/or in rotation.

Figure 1D:
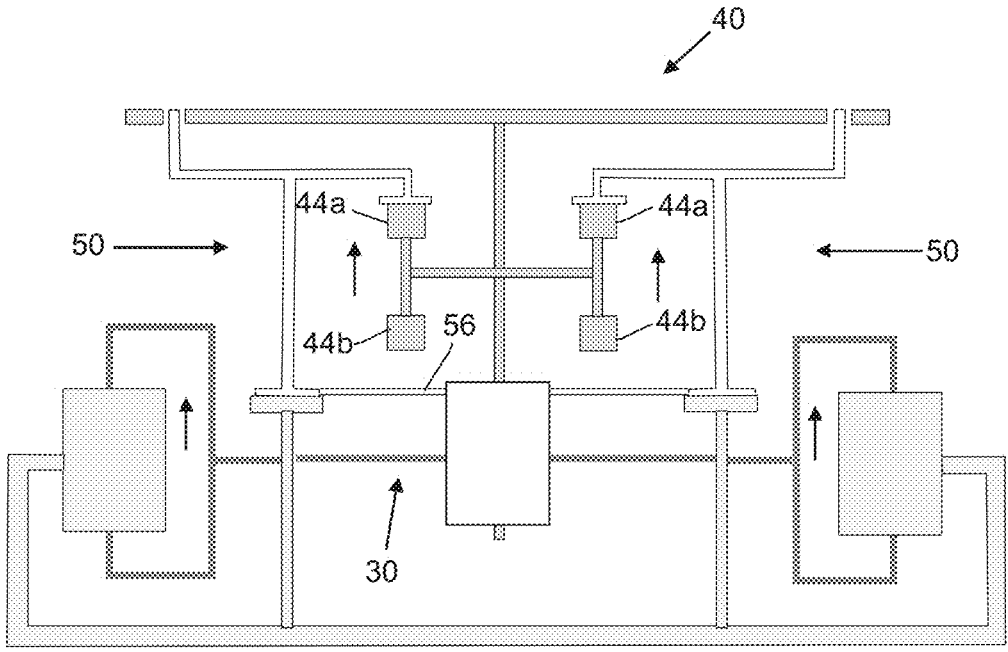
Figure 2:
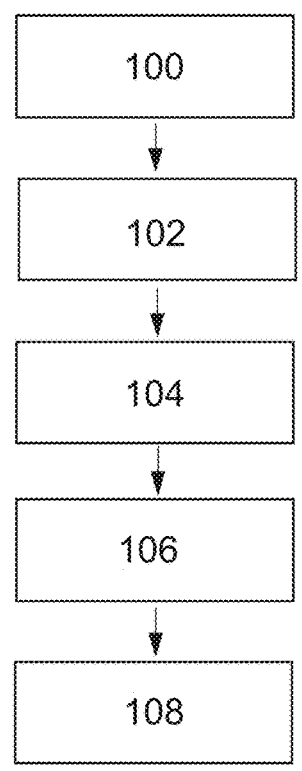
FIG. 2 illustrates the main steps to toggle the lift-pin mechanism of the Z-rotary wafer positioning stage between the first stable position and second stable position.
Figure 3:
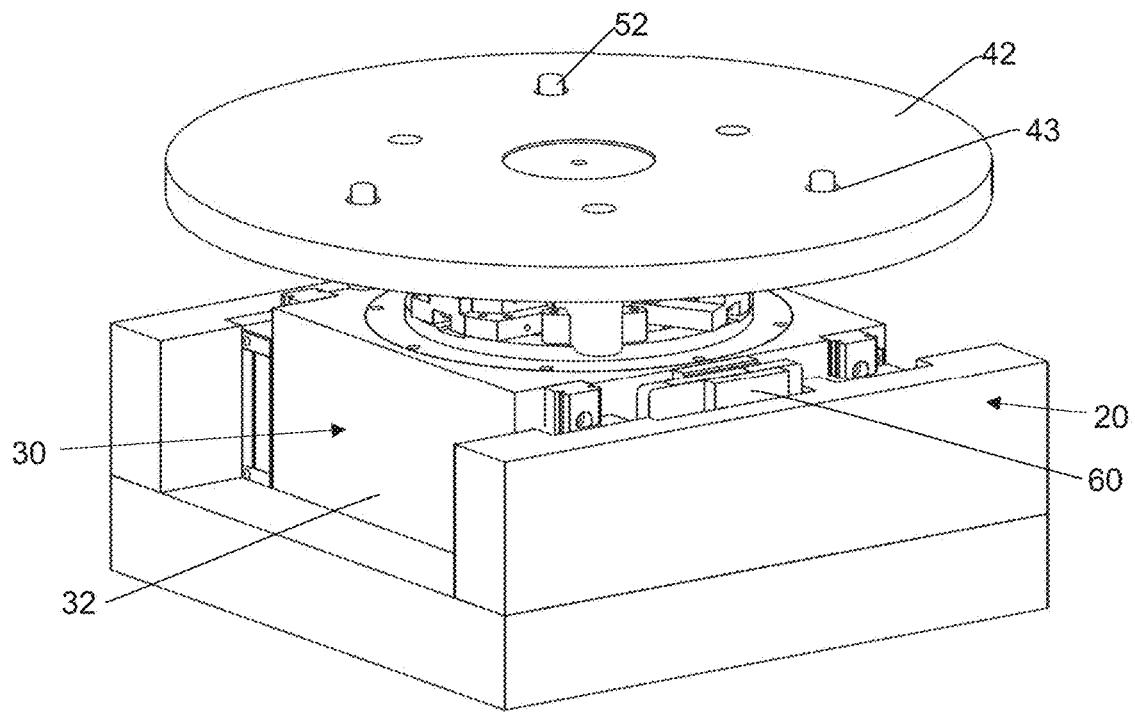
FIG. 3 is a perspective view of the Z-rotary wafer positioning stage.

Step 106 includes turning on again the electromagnets 58 while actuating the Z-unit 30 to move the rotary unit 40 upwardly to produce a holding force on the lift-pin mechanism 50 exceeding the magnetic force of the lower magnet 44b in order to disconnect the lower magnets 44b from the ring top side of the lift-pin mechanism 50 as illustrated in FIG. 1d. The electromagnets 58 are energized during the whole transition phase from the second stable position to the first stable position to firmly hold the ring 56 of the lift-pin mechanism 50 in order to counteract the attracting force of the upper magnets 44a on the lift pin mechanism 50 as they approach and are about to contact the pin holder 54 of the lift pin mechanism 50.

Step 108 includes turning off again the electromagnets 58 as soon as the upper magnets 44a contact the lift-pin mechanism 50. The lift-pin mechanism 50 is thus in the first stable position (see, e.g., FIG. 1a), in which the rotary unit 40 can be moved upwardly, downwardly, and/or in rotation.

Various modifications and variations to the described exemplary embodiments may be made without departing from the spirit and scope hereof. For example, the position and the number of the upper magnets, lower magnets, and electromagnets may vary according to the configuration of the lift-pin mechanism.

In addition, the upper and lower magnets may be mounted on respective upper and lower parts of the stationary unit instead being mounted on the rotary unit. In that case, the upper and lower magnets are arranged to contact, respectively, upper and lower parts of the rotary unit made of ferromagnetic metal to ensure a magnetic coupling in the first and second stable positions of the pin-lift mechanism.

LIST OF REFERENCE CHARACTERS

10 Z-Rotary wafer positioning stage
20 Stationary unit
22 Carriages
24 Cylindrical guide
28 Hard stop
28a Bent-over distal portion
30 Z-unit
32 Casing
34 Vertical rails
40 Rotary unit
42 Wafer chuck
43 Through-hole
44a Upper magnets
44b Lower magnets
45a Upper magnet support
45b Lower magnet support
46 Pin holder support
47 Carriage
48 Chuck support
50 Lift-pin mechanism
52 Lift-pin
54 Lift-pin holder (e.g., L-shaped)
54a First portion
54b Second portion
55 Vertical rail
56 Ring
58 Electromagnets
60 Linear motor
70 Rotary motor
80 Upper bearing
82a, 82b Outer and inner ring
84 Lower bearing
86a, 86b Outer and inner ring

What is claimed is:

1. A Z-rotary wafer positioning stage, comprising:
a stationary unit;
a Z-unit movable upwardly and downwardly relative to the stationary unit;
a rotary unit including a wafer chuck rotatably mounted in the Z-unit;
a rotary motor adapted to rotate the rotary unit relative to the Z-unit;
a lift-pin mechanism including lift-pins aligned with through-holes extending through the wafer chuck, the lift-pin mechanism being adapted to be toggled between a first position, in which distal ends of the lift-pins are at or below a level of a wafer chuck surface, and a second position, in which the distal ends of the lift-pins extend above the wafer chuck surface;

at least one upper magnet adapted to hold the lift-pin mechanism in the first position;

at least one lower magnet adapted to hold the lift-pin mechanism in the second position; and at least one electromagnet adapted to be energized to toggle the lift-pin mechanism from the second position to the first position.

2. The Z rotary wafer positioning stage according to claim 1, wherein the electromagnet is adapted to be energized to toggle the lift-pin mechanism from the first position to the second position.

3. The Z rotary wafer positioning stage according to claim 1, wherein the upper magnet and the lower magnet are mounted on the rotary unit.

4. The Z rotary wafer positioning stage according to claim 1, wherein the upper magnet is adapted to magnetically connect to an upper part of the lift-pin mechanism to maintain the lift-pins in the first position, and the lower magnet is adapted to magnetically connect to a lower part of the lift-pin mechanism to maintain the lift-pins in the second position.

5. The Z rotary wafer positioning stage according to claim 4, wherein the electromagnet is mounted on the stationary unit and is adapted to come into contact with the lower part of the lift-pin mechanism and to be energized to maintain the lift-pin mechanism in contact with the electromagnet to disconnect the lower magnet from the lift-pin mechanism to toggle the lift-pin mechanism from the second position to the first position.

6. The Z rotary wafer positioning stage according to claim 1, wherein the rotary unit includes three of the upper magnets and three of the lower magnets, the lift pin-mechanism including three of the lift-pins and three lift-pin holders, each lift-pin holder adapted to hold a respective one of the lift-pins, the lift-pin holders being made of a magnetic material and being shaped and configured to be in contact with respective upper magnets to maintain the lift-pin mechanism in the first position, or respective lower magnets to maintain the lift-pin mechanism in the second position.

7. The Z rotary wafer positioning stage according to claim 4, wherein the stationary unit includes three of the electromagnets arranged to magnetically connect to the lower part of the lift-pin mechanism.

8. The Z rotary wafer positioning stage according to claim 1, wherein the lift-pin mechanism includes a ring having a top side adapted to magnetically connect to the lower magnet and a bottom side adapted to magnetically connect to the electromagnet.

9. The Z rotary wafer positioning stage according to claim 1, wherein the stationary unit includes a cylindrical guide, the rotary unit being mounted around the cylindrical guide, one or more hard stops being connected to an inner wall of the cylindrical guide and adapted to limit an amplitude of an upward moment of the lift-pin mechanism.

10. The Z rotary wafer positioning stage according to claim 1, wherein the upper magnet and the lower magnet are respectively mounted on at least one upper magnet support and at least one lower magnet supports, an axial position of the upper magnet and/or the lower magnet (44a, 44b) being adjustable relative to the respective upper magnet support and/or lower magnet support to modify an amplitude of an axial displacement of the lift-pin mechanism between the first position and the second positions.

11. A method of operating the Z-rotary wafer positioning stage as recited in claim 1, comprising:

actuating the Z-unit to move the rotary unit downwardly to bring the lift-pin mechanism into contact with the electromagnet; and energizing the electromagnet while actuating the Z unit to move the rotary unit upwardly to produce a holding force on the lift-pin mechanism that exceeds a magnetic force of the lower magnet to disconnect the lower magnet from the lift-pin mechanism.

12. The method according to claim 11, wherein the actuating includes energizing the electromagnet to firmly hold the lift pin-mechanism to counteract an attracting force of the lower magnet on the lift-pin mechanism as the lower magnet is about to contact a lower part of the lift-pin mechanism.

13. The method according to claim 11, wherein the electromagnet is energized during an entire transition phase from the second position to the first position to firmly hold the lift-pin mechanism to counteract an attracting force of the upper magnet on the lift-pin mechanism as the upper magnet approaches and is about to contact an upper part of the lift-pin mechanism.

14. The method according to claim 12, wherein the electromagnet is energized during an entire transition phase from the second position to the first position to firmly hold the lift-pin mechanism to counteract an attracting force of the upper magnet on the lift-pin mechanism as the upper magnet approaches and is about to contact an upper part of the lift-pin mechanism.

15. A lift-pin mechanism assembly for a Z-rotary wafer positioning stage that includes a stationary unit, a Z-unit movable upwardly and downwardly relative to the stationary unit, a rotary unit including a wafer chuck rotatably mounted in the Z-unit, and a rotary motor adapted to rotate the rotary unit relative to the Z-unit, comprising:

a lift-pin mechanism including lift-pins adapted to be aligned with through-holes extending through the wafer chuck, the lift-pin mechanism being adapted to be toggled between a first position, in which distal ends of the lift-pins are at or below a level of a wafer chuck surface, and a second position, in which the distal ends of the lift-pins extend above the wafer chuck surface;

at least one upper magnet adapted to hold the lift-pin mechanism in the first position;

at least one lower magnet adapted to hold the lift-pin mechanism in the second position; and at least one electromagnet adapted to be energized to toggle the lift-pin mechanism from the second position to the first position.

* * * * *